(12) United States Patent
Liang

(10) Patent No.: US 11,545,469 B2
(45) Date of Patent: Jan. 3, 2023

(54) SEMICONDUCTOR PACKAGE AND MANUFACTURING METHOD THEREOF

(71) Applicant: Powerchip Semiconductor Manufacturing Corporation, Hsinchu (TW)

(72) Inventor: Yi-Chung Liang, Tainan (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 47 days.

(21) Appl. No.: 17/319,119

(22) Filed: May 13, 2021

(65) Prior Publication Data
US 2022/0302082 A1 Sep. 22, 2022

(30) Foreign Application Priority Data
Mar. 19, 2021 (TW) .................................. 110109889

(51) Int. Cl.
*H01L 25/065* (2006.01)
*H01L 23/00* (2006.01)
(Continued)

(52) U.S. Cl.
CPC ........ *H01L 25/0657* (2013.01); *H01L 23/293* (2013.01); *H01L 23/3142* (2013.01); *H01L 23/5384* (2013.01); *H01L 23/5386* (2013.01); *H01L 23/53209* (2013.01); *H01L 24/18* (2013.01); *H01L 2224/02331* (2013.01); *H01L 2224/02372* (2013.01); *H01L 2924/186* (2013.01)

(58) Field of Classification Search
CPC ............... H01L 23/293; H01L 23/3142; H01L 23/53209; H01L 23/5384; H01L 23/5386; H01L 24/18; H01L 25/0657; H01L 2224/02331; H01L 2224/02372; H01L 2924/186
See application file for complete search history.

(56) References Cited

U.S. PATENT DOCUMENTS 9,812,425 B2  11/2017  Cheah et al.
2012/0211878 A1  8/2012  Popovic et al.
(Continued)

FOREIGN PATENT DOCUMENTS

CN  110137096  8/2019
CN  112151514  12/2020

OTHER PUBLICATIONS

"Office Action of Taiwan Counterpart Application", dated Feb. 17, 2022, p. 1-p. 9.
(Continued)

*Primary Examiner* — Brook Kebede
(74) *Attorney, Agent, or Firm* — JCIPRNET

(57) ABSTRACT

A semiconductor package including a chip stack structure, a redistribution layer (RDL) structure and conductive plugs is provided. The chip stack structure includes stacked chips. Each of the chips includes a pad. The pads on the chips are located on the same side of the chip stack structure. The RDL structure is disposed on the first sidewall of the chip stack structure and adjacent to the pads. The conductive plugs penetrate through the RDL structure. The conductive plug is connected to the corresponding pad.

20 Claims, 6 Drawing Sheets

(51) Int. Cl.
   *H01L 23/538*   (2006.01)
   *H01L 23/532*   (2006.01)
   *H01L 23/29*    (2006.01)
   *H01L 23/31*    (2006.01)

(56) References Cited

U.S. PATENT DOCUMENTS

| | | | |
|---|---|---|---|
| 2018/0040587 A1 | 2/2018 | Tao et al. | |
| 2018/0114773 A1 | 4/2018 | Chiu et al. | |
| 2018/0342474 A1* | 11/2018 | Wu | H01L 21/486 |
| 2020/0006128 A1* | 1/2020 | Weng | H01L 23/5226 |

OTHER PUBLICATIONS

Takayuki Ohba, "Wafer level three-dimensional integration (3DI) using bumpless TSV interconnects for tera-scale generation," 2013 International Semiconductor Conference Dresden-Grenoble (ISCDG), Sep. 26-27, 2013, pp. 1-4.

K. Hummler et al., "TSV and Cu—Cu Direct Bond Wafer and Package-Level Reliability," 2013 IEEE 63rd Electronic Components and Technology Conference, May 28-31, 2013, pp. 41-48.

Fa Xing Che, "Dynamic Stress Modeling on Wafer Thinning Process and Reliability Analysis for TSV Wafer," IEEE Transactions on Components, Packaging and Manufacturing Technology, vol. 4, No. 9, Sep. 2014, pp. 1432-1440.

Feng-Min Chang et al., "Cu wire bonding process induced fail mechanism—Inter Layer Dielectric Crack," 2015 IEEE 22nd International Symposium on the Physical and Failure Analysis of Integrated Circuits, Jun. 29-Jul. 2, 2015, pp. 92-95.

\* cited by examiner

SEMICONDUCTOR PACKAGE AND MANUFACTURING METHOD THEREOF

CROSS-REFERENCE TO RELATED APPLICATION

This application claims the priority benefit of Taiwan application serial no. 110109889, filed on Mar. 19, 2021. The entirety of the above-mentioned patent application is hereby incorporated by reference herein and made a part of this specification.

BACKGROUND OF THE INVENTION

Field of the Invention

The invention relates to a semiconductor package and a manufacturing method thereof, and particularly relates to a semiconductor package having a chip stack structure and a manufacturing method thereof.

Description of Related Art

In the current chip stacking package process, in order to facilitate the electrical connection between the chips, a thinning process is performed on the substrate of each chip. Therefore, cracks are often generated in the substrate of each chip, resulting in a decrease in the yield. Furthermore, in the current chip stack package, the through-silicon via (TSV) penetrating through the substrate of the chip is used for electrical connection between the chips. However, the etching process used to form the TSV may also cause cracks in the substrate of the chip, resulting in a decrease in the yield. Therefore, the current chip stack package has the problems of the complicated manufacturing process and the low yield.

SUMMARY OF THE INVENTION

The invention provides a semiconductor package and a manufacturing method thereof, which can reduce the complexity of the manufacturing process and improve the yield.

The invention provides a semiconductor package, which includes a chip stack structure, a redistribution layer (RDL) structure and conductive plugs. The chip stack structure includes stacked chips. Each of the chips includes a pad. The pads on the chips are located on the same side of the chip stack structure. The RDL structure is disposed on the first sidewall of the chip stack structure and adjacent to the pads. The conductive plugs penetrate through the RDL structure. The conductive plug is connected to the corresponding pad.

According to an embodiment of the invention, in the semiconductor package, the extension direction of the RDL structure may be parallel to the stack direction of the chips.

According to an embodiment of the invention, in the semiconductor package, each of the chips may include the pads. The pads on the same chip may be located on the same side of the same chip.

According to an embodiment of the invention, in the semiconductor package, each of the chips may further include a substrate and a semiconductor device. The substrate may have a first surface and a second surface opposite to each other. The pad is disposed on the first surface. The semiconductor device is disposed on the first surface and electrically connected to the pad.

According to an embodiment of the invention, in the semiconductor package, each of the chips may further include a dielectric layer and an interconnect structure. The dielectric layer is disposed on the first surface and covers the semiconductor device. The interconnect structure is disposed in the dielectric layer. The semiconductor device and the pad may be electrically connected to each other by the interconnect structure.

According to an embodiment of the invention, in the semiconductor package, each of the chips may further include a seal ring. The sealing ring may surround the semiconductor device and the pad. The conductive plug may penetrate through the sealing ring.

According to an embodiment of the invention, in the semiconductor package, the extension direction of the RDL structure may be perpendicular to the first surface. The extension direction of the conductive plug may be parallel to the first surface.

According to an embodiment of the invention, in the semiconductor package, the chip stack structure may further include an adhesive. The adhesive is disposed between two adjacent chips.

According to an embodiment of the invention, in the semiconductor package, the RDL structure may include a substrate and an RDL. The substrate is disposed on the first sidewall of the chip stack structure. The RDL is disposed on the substrate and located on one side of the substrate away from the chip stack structure. The RDL may include a dielectric layer and a redistribution circuit. The dielectric layer is disposed on the substrate. The redistribution circuit is disposed in the dielectric layer and may be electrically connected to the conductive plug.

According to an embodiment of the invention, in the semiconductor package, the RDL structure may further include an error detecting circuit. The error detecting circuit is disposed in the dielectric layer and electrically connected to the redistribution circuit.

According to an embodiment of the invention, the semiconductor package may further include an adhesive. The adhesive is disposed between the RDL structure and the first sidewall of the chip stack structure.

According to an embodiment of the invention, the semiconductor package may further include a carrier. The carrier is disposed on the second sidewall of the chip stack structure. The second sidewall may be opposite to the first sidewall.

According to an embodiment of the invention, the semiconductor package may further include an adhesive. The adhesive is disposed between the carrier and the second sidewall of the chip stack structure.

According to an embodiment of the invention, the semiconductor package may further include an encapsulant. The encapsulant surrounds the chip stack structure.

The invention provides a manufacturing method of a semiconductor package, which includes the following steps. A chip stack structure is provided. The chip stack structure has a first sidewall and a second sidewall opposite to each other. The chip stack structure includes stacked chips. Each of the chips includes a pad. The pads on the chips are located on the same side of the chip stack structure. The second sidewall of the chip stack structure is placed on a carrier. An RDL structure is placed on the first sidewall of the chip stack structure. The RDL structure is adjacent to the pad. Conductive plugs penetrating through the RDL structure are formed. The conductive plug is connected to the corresponding pad.

According to an embodiment of the invention, in the manufacturing method of the semiconductor package, the chip stack structure may further include an adhesive. The adhesive is disposed between two adjacent chips.

According to an embodiment of the invention, the manufacturing method of the semiconductor package may further include the following step. An adhesive is provided between the second sidewall of the chip stack structure and the carrier.

According to an embodiment of the invention, the manufacturing method of the semiconductor package may further include the following step. An adhesive is provided between the RDL structure and the first sidewall of the chip stack structure.

According to an embodiment of the invention, the manufacturing method of the semiconductor package may further include the following step. An encapsulant surrounding the chip stack structure is formed.

According to an embodiment of the invention, in the manufacturing method of the semiconductor package, the method of forming the conductive plugs may include the following steps. Openings are formed in the RDL structure and the chips. The opening penetrates through the RDL structure and exposes the corresponding pad. A conductive layer filling the openings is formed on the RDL structure. The conductive layer outside the openings is removed.

Based on the above description, in the semiconductor package and the manufacturing method thereof according to the invention, the pads on the chips are located on the same side of the chip stack structure, the RDL structure is disposed on the first sidewall of the chip stack structure and adjacent to the pads, and the conductive plug penetrates through the RDL structure and is connected to the corresponding pad. Therefore, the electrical connection between the chips can be made by the conductive plugs and the RDL structure. In addition, in the semiconductor package and the manufacturing method thereof according to the invention, since the electrical connection between the chips can be made by the conductive plugs and the RDL structure, it is not necessary to perform the thinning process on the substrate of each of the chips, thereby preventing the generation of cracks in the substrate of the chip. Furthermore, in the semiconductor package and the manufacturing method thereof according to the invention, since the electrical connection between the chips can be made by the conductive plugs and the RDL structure, it is not necessary to form a conductive plug that penetrates through the substrate of the chip and is used for electrical connection between the chips, thereby preventing the generation of cracks in the substrate of the chip. Therefore, the semiconductor package and the manufacturing method thereof according to the invention can reduce the complexity of the manufacturing process and improve the yield.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
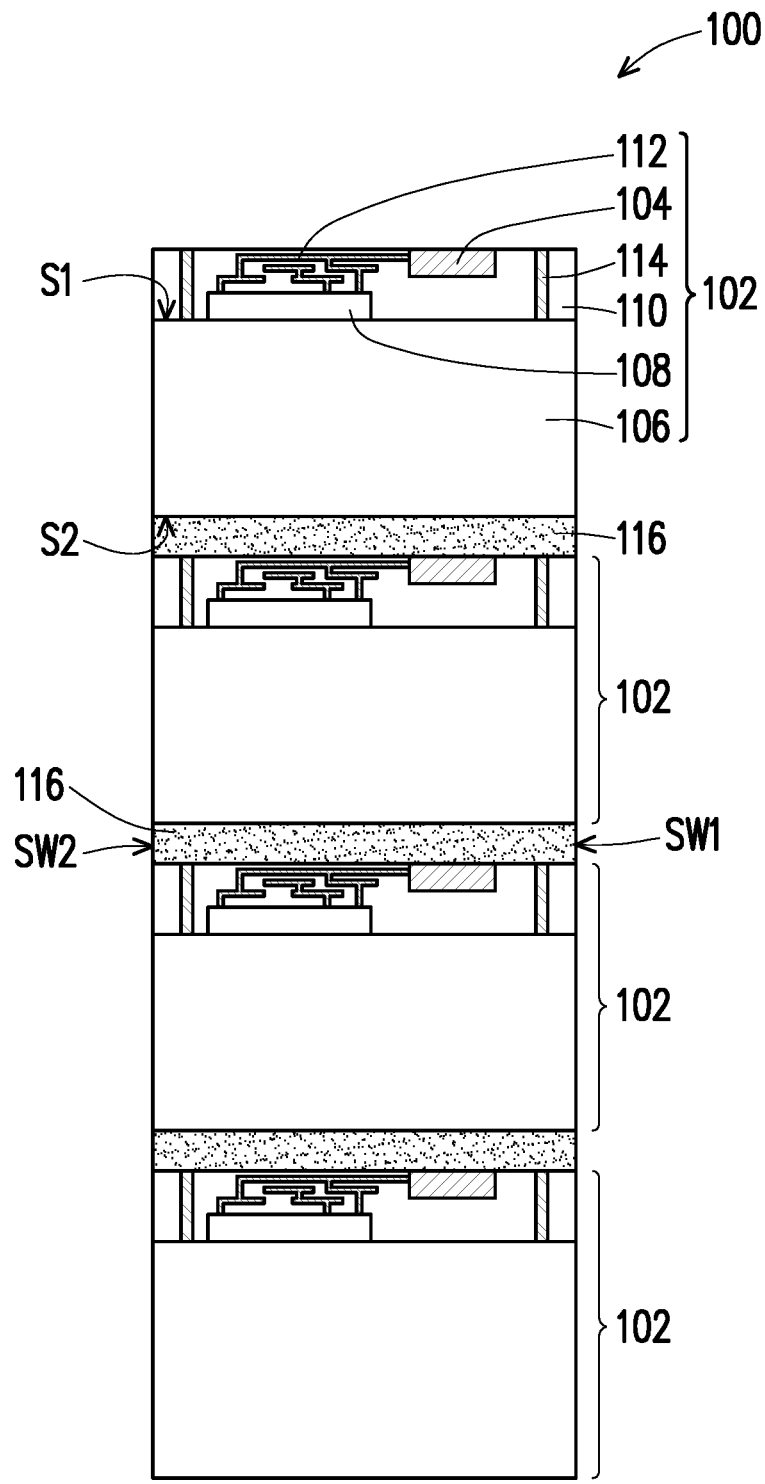
FIG. 1A to FIG. 1E are cross-sectional views illustrating a manufacturing process of a semiconductor package according to an embodiment of the invention.

FIG. 1A to FIG. 1E are cross-sectional views illustrating a manufacturing process of a semiconductor package according to an embodiment of the invention. FIG. 2 is a schematic perspective view of the chip in FIG. 1A. In FIG. 1A, some of the components (e.g., the interconnect structure 112) in FIG. 2 are simplified to clearly describe the configuration relationship between the components in FIG. 1A.

Referring to FIG. 1A and FIG. 2, a chip stack structure 100 is provided. The chip stack structure 100 has a sidewall SW1 and a sidewall SW2 opposite to each other. The chip stack structure 100 includes stacked chips 102. Each of the chips 102 includes a pad 104. The pads 104 on the chips 102 are located on the same side of the chip stack structure 100. In some embodiments, each of the chips 102 may include the pads 104. The pads 104 on the same chip 102 may be located on the same side of the same chip 102.

In addition, each of the chips 102 may further include at least one of a substrate 106, a semiconductor device 108, a dielectric layer 110, an interconnect structure 112, and a sealing ring 114. The substrate 106 may have a surface S1 and a surface S2 opposite to each other. The substrate 106 may be a semiconductor substrate such as a silicon substrate. The pad 104 is disposed on the surface S1. The material of the pad 104 is, for example, a conductive material such as metal (e.g., copper, aluminum, or tungsten). The semiconductor device 108 is disposed on the surface S1 and electrically connected to the pad 104. The semiconductor device 108 may include an active device, a passive device, or a combination thereof. The dielectric layer 110 is disposed on the surface S1 and covers the semiconductor device 108. Furthermore, the pad 104 may be disposed in the dielectric layer 110. In some embodiments, the dielectric layer 110 may be a multilayer structure. The material of the dielectric layer 110 is, for example, silicon oxide, silicon nitride, silicon oxynitride, or a combination thereof. The interconnect structure 112 is disposed in the dielectric layer 110. The semiconductor device 108 and the pad 104 may be electrically connected to each other by the interconnect structure 112. The material of the interconnect structure 112 is, for example, a conductive material such as metal (e.g., copper, aluminum, tungsten, or a combination thereof). The sealing ring 114 may surround the semiconductor device 108 and the pad 104. The sealing ring 114 may be disposed in the dielectric layer 110. When cutting the wafer (not shown) into the chip 102, the sealing ring 114 can be used to prevent the generation of cracks in the chip 102.

Moreover, the chip stack structure 100 may further include an adhesive 116. The adhesive 116 is disposed between two adjacent chips 102. The adhesive 116 can be used to bond two adjacent chips 102 together. In some embodiments, the method of forming the chip stack structure 100 may include the following steps. First, a wafer (not shown) is cut into the chips 102, and then the chips 102 are bonded together by using the adhesive 116 to form the chip stack structure 100 including the stacked chips 102. In other embodiments, the method of forming the chip stack structure 100 may include the following steps. First, wafers (not shown) are bonded together by using the adhesive 116, and then the bonded wafers are cut to form the chip stack structure 100 including the stacked chips 102.

Figure 1B:
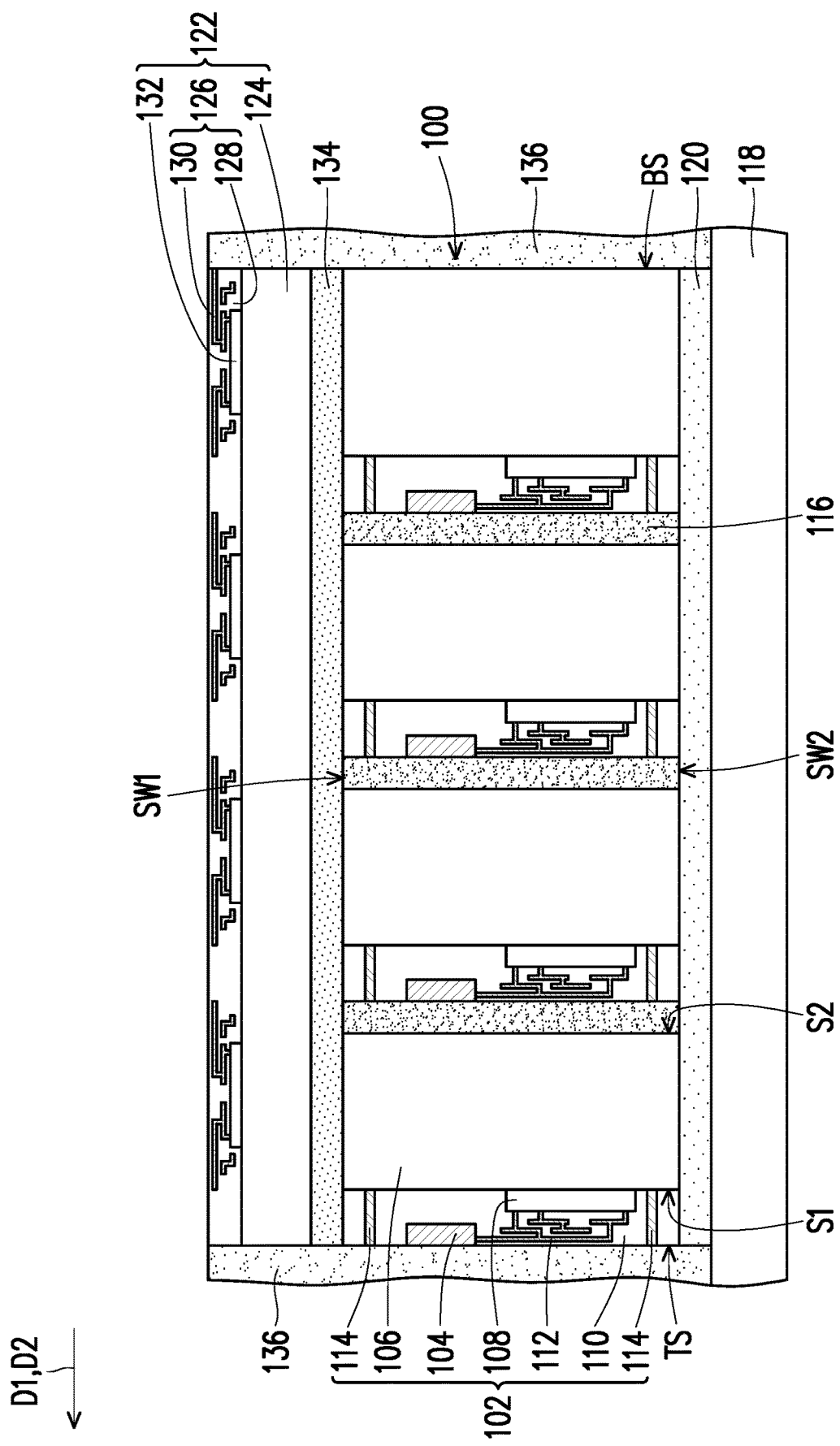
Figure 2:
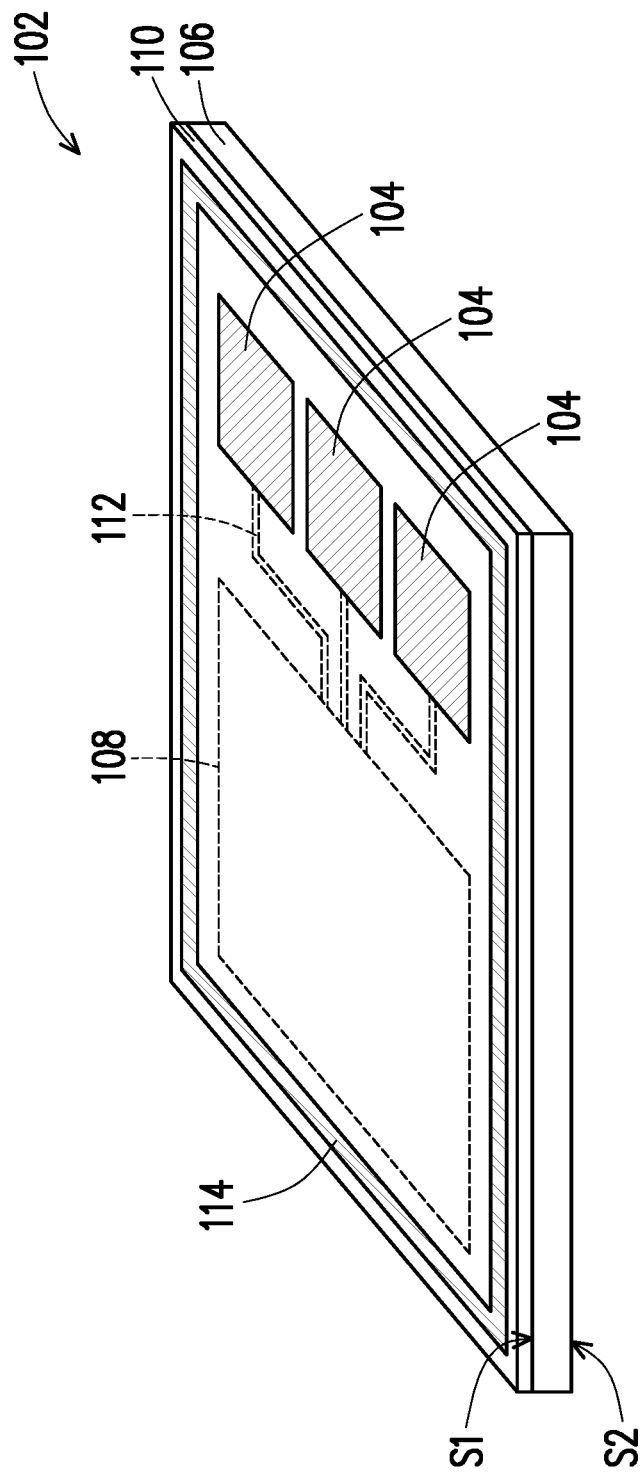
FIG. 2 is a schematic perspective view of the chip in FIG. 1A.

Referring to FIG. 1B, the sidewall SW2 of the chip stack structure 100 is placed on a carrier 118. The carrier 118 can be used to carry the chip stack structure 100 to facilitate subsequent manufacturing processes. The carrier 118 may be a semiconductor substrate such as a silicon substrate. In addition, an adhesive 120 may be provided between the sidewall SW2 of the chip stack structure 100 and the carrier 118 to bond the chip stack structure 100 and the carrier 118 together.

Furthermore, an RDL structure 122 is placed on the sidewall SW1 of the chip stack structure 100. The RDL structure 122 is adjacent to the pads 104. The extension direction D1 of the RDL structure 122 may be perpendicular to the surface S1. Moreover, the extension direction D1 of the RDL structure 122 may be parallel to the stack direction D2 of the chips 102.

The RDL structure 122 may include a substrate 124 and an RDL 126. The substrate 124 is disposed on the sidewall SW1 of the chip stack structure 100. The substrate 124 may be a semiconductor substrate such as a silicon substrate. The RDL 126 is disposed on the substrate 124 and located on one side of the substrate 124 away from the chip stack structure 100. The RDL 126 may include a dielectric layer 128 and a redistribution circuit 130. The dielectric layer 128 is disposed on the substrate 124. In some embodiments, the dielectric layer 128 may be a multilayer structure. The material of the dielectric layer 128 is, for example, silicon oxide, silicon nitride, silicon oxynitride, or a combination thereof. The redistribution circuit 130 is disposed in the dielectric layer 128. The material of the redistribution circuit 130 is, for example, a conductive material such as metal (e.g., copper, aluminum, tungsten, or a combination thereof).

In addition, the RDL structure 122 may further include an error detecting circuit 132. The error detecting circuit 132 is disposed in the dielectric layer 128 and electrically connected to the redistribution circuit 130. In some embodiments, when a certain chip 102 in the chip stack structure 100 is damaged, the error detecting circuit 132 can detect which chip 102 is damaged, so that the damaged chip 102 can be replaced. Furthermore, an adhesive 134 may be provided between the RDL structure 122 and the sidewall SW1 of the chip stack structure 100 to bond the RDL structure 122 and the chip stack structure 100 together.

On the other hand, an encapsulant 136 surrounding the chip stack structure 100 may be formed. The encapsulant 136 may cover the top surface TS and bottom surface BS of the chip stack structure 100. Furthermore, the encapsulant 136 may further surround the RDL structure 122. The material of the encapsulant 136 may be a molding compound such as polyimide.

Figure 1C:
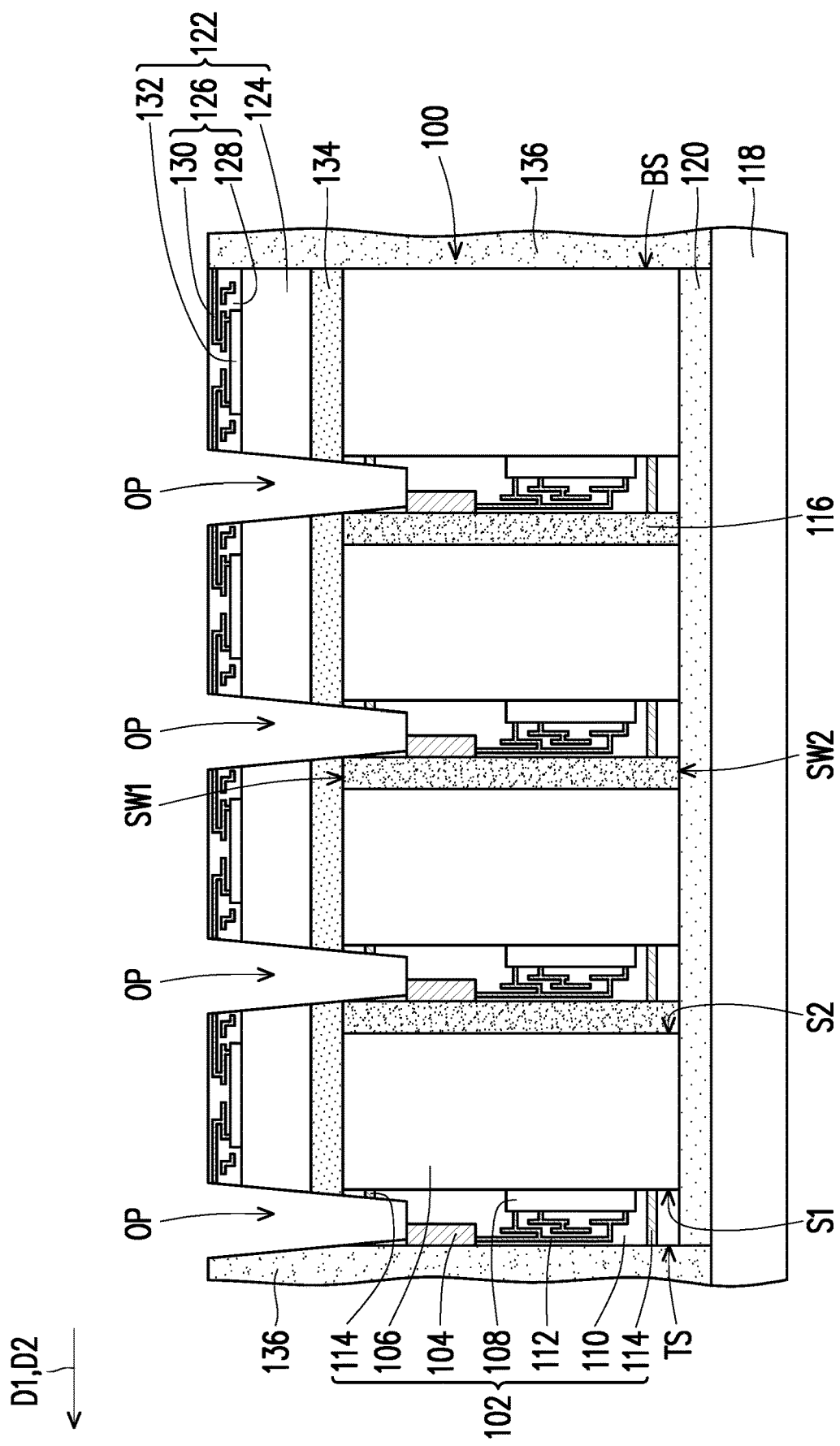

Referring to FIG. 1C, openings OP may be formed in the RDL structure 122 and the chips 102. The opening OP may penetrate through the RDL structure 122 and exposes the corresponding pad 104. The opening OP may be formed by patterning the RDL structure 122 and the chips 102 by a lithography process and an etching process. For example, a portion of the RDL structure 122, a portion of the adhesive 134, and a portion of the dielectric layer 110 may be removed by using the sealing ring 114 as an etching stop layer, and then a portion of the sealing ring 114 and a portion of the dielectric layer 110 may be removed by the subsequent etching process to form the openings OP that expose the pads 104.

Figure 1D:
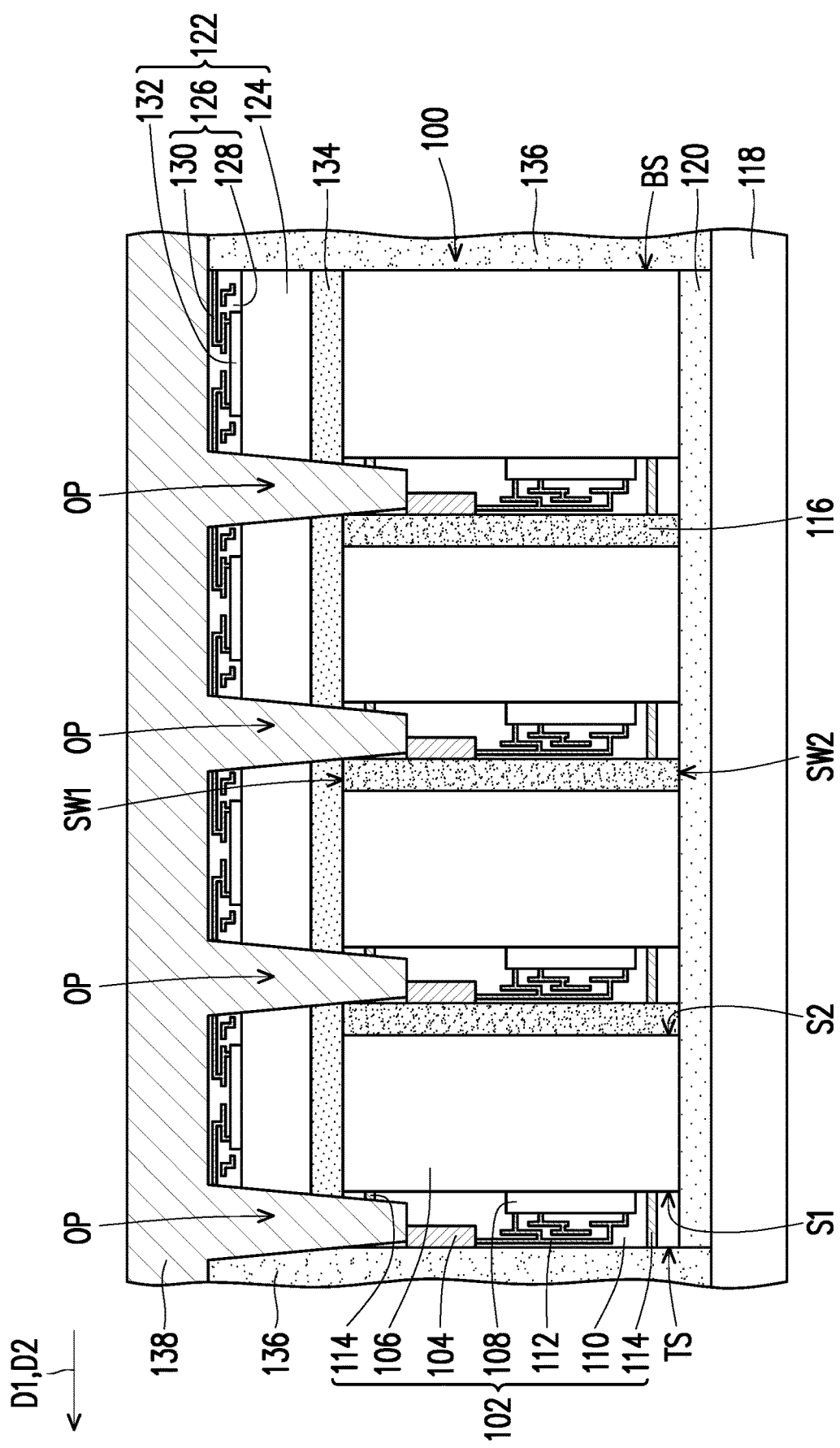

Referring to FIG. 1D, a conductive layer 138 filling the openings OP may be formed on the RDL structure 122. The material of the conductive layer 138 is, for example, metal such as copper, aluminum, or tungsten. The method of forming the conductive layer 138 is, for example, an electroplating method, a physical vapor deposition method, or a chemical vapor deposition method.

Figure 1E:
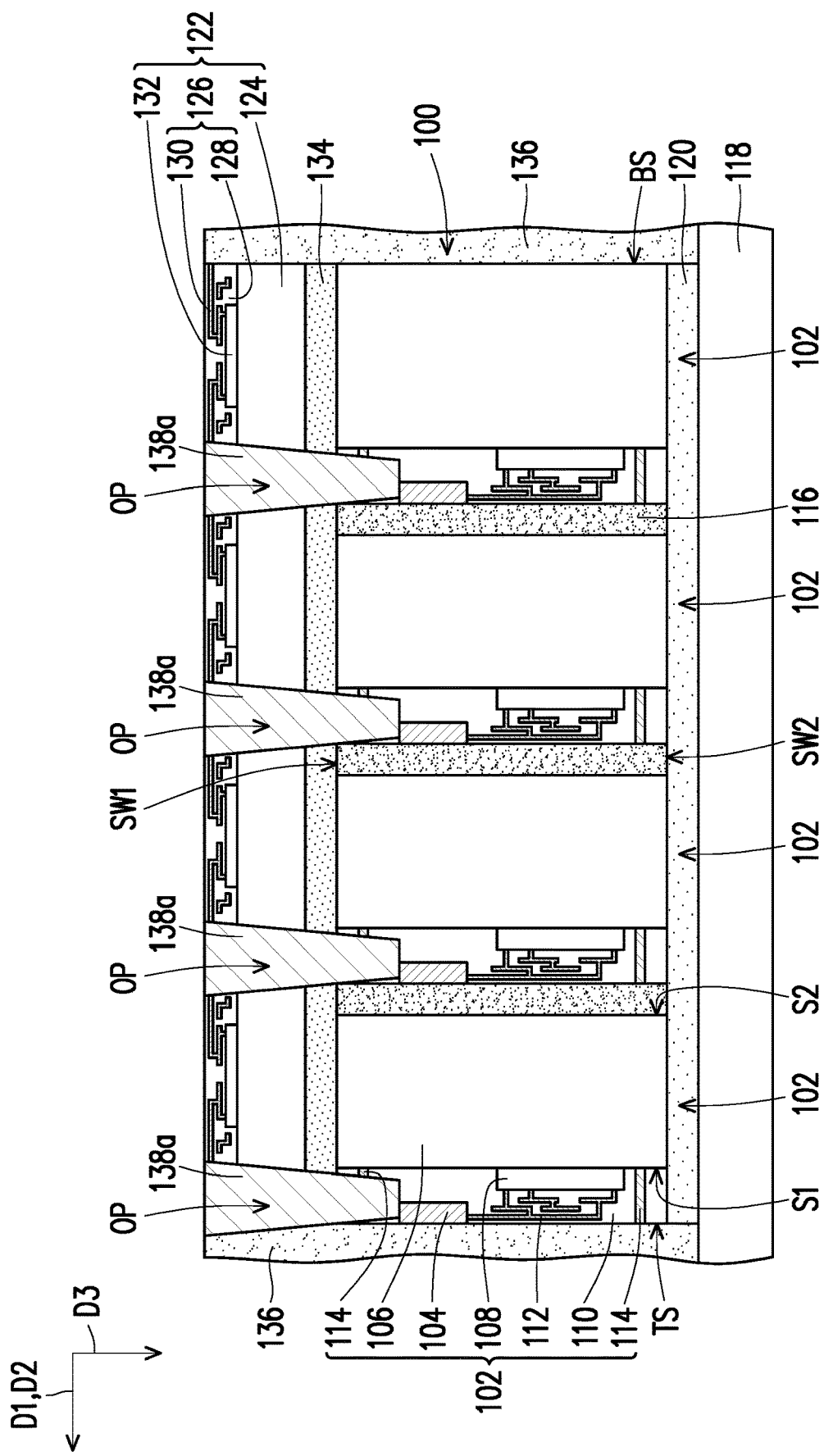

Referring to FIG. 1E, the conductive layer 138 outside the openings OP may be removed, thereby forming conductive plugs 138a penetrating through the RDL structure 122. The conductive plug 138a is connected to the corresponding pad 104. In some embodiments, the conductive plug 138a may be directly connected to the corresponding pad 104. The conductive plug 138a may penetrate through the sealing ring 114. The redistribution circuit 130 may be electrically connected to the conductive plug 138a. In some embodiments, the conductive plug 138a may be a through-silicon via (TSV). The method of removing the conductive layer 138 outside the openings OP is, for example, a chemical mechanical polishing method.

In addition, the extension direction D3 of the conductive plug 138a may be parallel to the surface S1. Furthermore, the extension direction D3 of the conductive plug 138a may be perpendicular to the extension direction D1 of the RDL structure 122.

Moreover, after the conductive plugs 138a are formed, it may be determined whether to remove the carrier 118 according to product requirements. In the present embodiment, for example, the carrier 118 is remained, but the invention is not limited thereto.

Hereinafter, the semiconductor package 10 of the above embodiment will be described with reference to FIG. 1E. In addition, although the method for forming the semiconductor package 10 is described by taking the foregoing method as an example, the invention is not limited thereto.

Referring to FIG. 1E, the semiconductor package 10 includes a chip stack structure 100, an RDL structure 122, and conductive plugs 138a. The chip stack structure 100 includes stacked chips 102. Each of the chips 102 includes a pad 104. The pads 104 on the chips 102 are located on the same side of the chip stack structure 100. In some embodiments, each of the chips 102 may include the pads 104. The pads 104 on the same chip 102 may be located on the same side of the same chip 102. In addition, each of the chips 102 may further include at least one of a substrate 106, a semiconductor device 108, a dielectric layer 110, an interconnect structure 112, and a sealing ring 114. The substrate 106 may have a surface S1 and a surface S2 opposite to each other. The pad 104 is disposed on the surface S1. The semiconductor device 108 is disposed on the surface S1 and electrically connected to the pad 104. The dielectric layer 110 is disposed on the surface S1 and covers the semiconductor device 108. The interconnect structure 112 is disposed in the dielectric layer 110. The semiconductor device 108 and the pad 104 may be electrically connected to each other by the interconnect structure 112. The sealing ring 114 may surround the semiconductor device 108 and the pad 104. Furthermore, the chip stack structure 100 may further include an adhesive 116. The adhesive 116 is disposed between two adjacent chips 102.

The RDL structure 122 is disposed on the sidewall SW1 of the chip stack structure 100 and adjacent to the pad 104. The RDL structure 122 may include a substrate 124 and an RDL 126. The substrate 124 is disposed on the sidewall SW1 of the chip stack structure 100. The RDL 126 is disposed on the substrate 124 and located on one side of the substrate 124 away from the chip stack structure 100. The RDL 126 may include a dielectric layer 128 and a redistribution circuit 130. The dielectric layer 128 is disposed on the substrate 124. The redistribution circuit 130 is disposed in the dielectric layer 128. Moreover, the RDL structure 122 may further include an error detecting circuit 132. The error detecting circuit 132 is disposed in the dielectric layer 128 and electrically connected to the redistribution circuit 130.

The conductive plugs 138a penetrate through the RDL structure 122. The conductive plug 138a is connected to the corresponding pad 104. In addition, the conductive plug 138a may penetrate through the sealing ring 114. The redistribution circuit 130 may be electrically connected to the conductive plug 138a.

In addition, the semiconductor package 10 may further include at least one of a carrier 118, an adhesive 120, an adhesive 134, and an encapsulant 136. The carrier 118 is disposed on the sidewall SW2 of the chip stack structure 100. The sidewall SW2 may be opposite to the sidewall SW1. The adhesive 120 is disposed between the carrier 118 and the sidewall SW2 of the chip stack structure 100. The adhesive 134 is disposed between the RDL structure 122 and the sidewall SW1 of the chip stack structure 100. The encapsulant 136 surrounds the chip stack structure 100 and may further surround the RDL structure 122.

Furthermore, the material, the detailed arrangement, the forming method, and the effect of each component in the semiconductor package 10 have been described in detail in the foregoing embodiments, and the description thereof is not repeated here.

Based on the foregoing embodiment, in the semiconductor package 10 and the manufacturing method thereof, the pads 104 on the chips 102 are located on the same side of the chip stack structure 100, the RDL structure 122 is disposed on the sidewall SW1 of the chip stack structure 100 and adjacent to the pad 104, and the conductive plug 138a penetrates through the RDL structure 122 and connected to the corresponding pad 104. Therefore, the electrical connection between the chips 102 can be made by the conductive plugs 138a and the RDL structure 122. In addition, in the semiconductor package 10 and the manufacturing method thereof, since the electrical connection between the chips 102 can be made by the conductive plugs 138a and the RDL structure 122, it is not necessary to perform the thinning process on the substrate 106 of each of the chips 102, thereby preventing the generation of cracks in the substate 106 of the chip 102. Furthermore, in the semiconductor package 10 and the manufacturing method thereof, since the electrical connection between the chips 102 can be made by the conductive plugs 138a and the RDL structure 122, it is not necessary to form a conductive plug that penetrates through the substrate 106 of the chip 102 and is used for electrical connection between the chips 102, thereby preventing the generation of cracks in the substate 106 of the chip 102. Therefore, the semiconductor package 10 and the manufacturing method thereof can reduce the complexity of the manufacturing process and improve the yield.

In summary, in the semiconductor package and the manufacturing method thereof in the aforementioned embodiments, the RDL structure is disposed on one side of the chip stack structure and adjacent to the pad, and the pad of the chip is electrically connected to the RDL structure by the conductive plug. Therefore, the electrical connection between the chips can be made by the conductive plugs and the RDL structure, thereby reducing the complexity of the manufacturing process and improving the yield.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor package, comprising:
    a chip stack structure comprising a stack of a plurality of chips, wherein each of the plurality of chips comprises a pad, and the pad on each of the plurality of chips is located on the same side of the chip stack structure;
    a redistribution layer (RDL) structure disposed on a first sidewall of the chip stack structure and adjacent to the pad of each of the plurality of chips; and
    a plurality of conductive plugs penetrating through the RDL structure, wherein each of the plurality of conductive plugs is connected to the corresponding pad.

2. The semiconductor package according to claim 1, wherein an extension direction of the RDL structure is parallel to a stack direction of the plurality of chips.

3. The semiconductor package according to claim 1, wherein the pad of each of the plurality of chips comprises a plurality of first pads, and the plurality of first pads on each of the plurality of chips are located on the same side of each of the plurality of chips.

4. The semiconductor package according to claim 1, wherein each of the plurality of chips further comprises:
    a substrate having a first surface and a second surface opposite to each other, wherein the pad is disposed on the first surface; and
    a semiconductor device disposed on the first surface and electrically connected to the pad.

5. The semiconductor package according to claim 4, wherein each of the plurality of chips further comprises:
    a dielectric layer disposed on the first surface and covering the semiconductor device; and
    an interconnect structure disposed in the dielectric layer, wherein the semiconductor device and the pad are electrically connected to each other by the interconnect structure.

6. The semiconductor package according to claim 4, wherein each of the plurality of chips further comprises:
    a sealing ring surrounding the semiconductor device and the pad, wherein each of the plurality of conductive plugs penetrates through the corresponding sealing ring.

7. The semiconductor package according to claim 4, wherein an extension direction of the RDL structure is perpendicular to the first surface, and an extension direction of each of the plurality of conductive plugs is parallel to the first surface.

8. The semiconductor package according to claim 1, wherein the chip stack structure further comprises:
    an adhesive disposed between two adjacent chips.

9. The semiconductor package according to claim 1, wherein the RDL structure comprises:
    a substrate disposed on the first sidewall of the chip stack structure; and
    an RDL disposed on the substrate and located on one side of the substrate away from the chip stack structure, wherein the RDL comprises:
        a dielectric layer disposed on the substrate; and
        a redistribution circuit disposed in the dielectric layer and electrically connected to the plurality of conductive plugs.

10. The semiconductor package according to claim 9, wherein the RDL structure further comprises:
    an error detecting circuit disposed in the dielectric layer and electrically connected to the redistribution circuit.

11. The semiconductor package according to claim 1, further comprising:

an adhesive disposed between the RDL structure and the first sidewall of the chip stack structure.

12. The semiconductor package according to claim 1, further comprising:
a carrier disposed on a second sidewall of the chip stack structure, wherein the second sidewall is opposite to the first sidewall.

13. The semiconductor package according to claim 12, further comprising:
an adhesive disposed between the carrier and the second sidewall of the chip stack structure.

14. The semiconductor package according to claim 1, further comprising:
an encapsulant surrounding the chip stack structure.

15. A manufacturing method of a semiconductor package, comprising:
providing a chip stack structure, wherein the chip stack structure has a first sidewall and a second sidewall opposite to each other and comprises a stack of a plurality of chips, each of the plurality of chips comprises a pad, and the pad on each of the plurality of chips is located on the same side of the chip stack structure;
placing the second sidewall of the chip stack structure on a carrier;
placing a redistribution layer (RDL) structure on the first sidewall of the chip stack structure, wherein the RDL structure is adjacent to the pad of each of the plurality of chips; and
forming a plurality of conductive plugs penetrating through the RDL structure,
wherein each of the plurality of conductive plugs is connected to the corresponding pad.

16. The manufacturing method of the semiconductor package according to claim 15, wherein the chip stack structure further comprises:
an adhesive disposed between two adjacent chips.

17. The manufacturing method of the semiconductor package according to claim 15, further comprising:
providing an adhesive between the second sidewall of the chip stack structure and the carrier.

18. The manufacturing method of the semiconductor package according to claim 15, further comprising:
providing an adhesive between the RDL structure and the first sidewall of the chip stack structure.

19. The manufacturing method of the semiconductor package according to claim 15, further comprising:
forming an encapsulant surrounding the chip stack structure.

20. The manufacturing method of the semiconductor package according to claim 15, wherein a method of forming the plurality of conductive plugs comprises:
forming a plurality of openings in the RDL structure and the plurality of chips, wherein each of the plurality of opening penetrates through the RDL structure and exposes the corresponding pad; and
forming a conductive layer filling the plurality of openings on the RDL structure; and
removing the conductive layer outside the plurality of openings.

* * * * *